United States Patent [19]

Parulski et al.

[11] Patent Number: 5,563,658
[45] Date of Patent: Oct. 8, 1996

[54] ELECTRONIC CAMERA WITH RAPID AUTOMATIC FOCUS OF AN IMAGE UPON AN IMAGE SENSOR

[75] Inventors: Kenneth A. Parulski, Rochester; George E. Lathrop, Dansville, both of N.Y.

[73] Assignee: Eastman Kodak Company, Rochester, N.Y.

[21] Appl. No.: 357,818

[22] Filed: Dec. 16, 1994

[51] Int. Cl.$^6$ ............................................. H04N 5/232
[52] U.S. Cl. .............................. 348/350; 348/353
[58] Field of Search .......................... 348/345, 349, 348/350, 353, 317

[56] References Cited

U.S. PATENT DOCUMENTS

| | | | |
|---|---|---|---|
| 4,047,187 | 9/1977 | Mashimo et al. | 354/23 |
| 4,614,975 | 9/1986 | Kaite | 358/227 |
| 4,752,831 | 6/1988 | Biber et al. | 358/227 |
| 4,876,608 | 10/1989 | Eaton | 358/443 |
| 4,974,092 | 11/1990 | Kawamura et al. | 358/227 |
| 5,051,833 | 9/1991 | Tsuji | 348/350 |
| 5,164,756 | 11/1992 | Hirasawa | 354/400 |
| 5,182,649 | 1/1993 | Miyazaki | 358/227 |
| 5,233,431 | 8/1993 | Yoshida et al. | 358/227 |
| 5,363,137 | 11/1994 | Suga et al. | 348/350 |

Primary Examiner—Wendy Garber
Attorney, Agent, or Firm—David M. Woods

[57] ABSTRACT

A technique for automatically focusing the lens of an electronic still camera employs a full frame image sensor 20 and a mechanical shutter 24. The image sensor 20 itself is operated first in a "fast flush" mode to focus a lens 22, and then in a normal readout mode to obtain the final still image. To focus the lens 22, the shutter 24 is opened, and an image is integrated on the sensor 20. The average contrast of a central region 66 of the image is used to determine how well the image is focused. The portion of the image surrounding the central region 66 is rapidly read out and discarded, using "fast flush" clocking where the vertical and horizontal registers are continuously clocked. The process is repeated numerous times with the shutter remaining open as the lens focus is adjusted until the maximum average contrast is obtained. At this point, the shutter is closed, and the entire sensor is cleared using "fast flush" clocking. The shutter is again opened to capture the final image, and closed while the final image is read out.

9 Claims, 5 Drawing Sheets

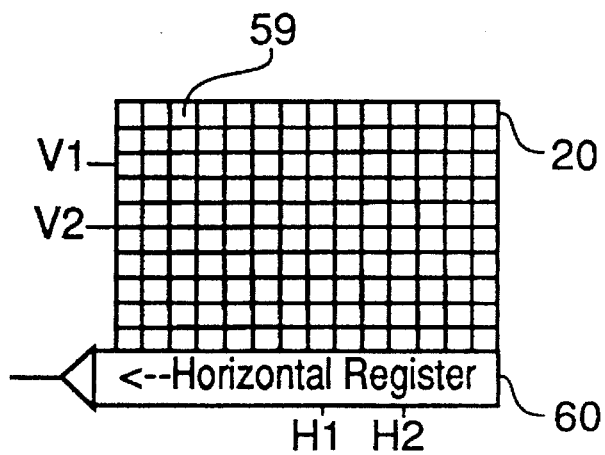
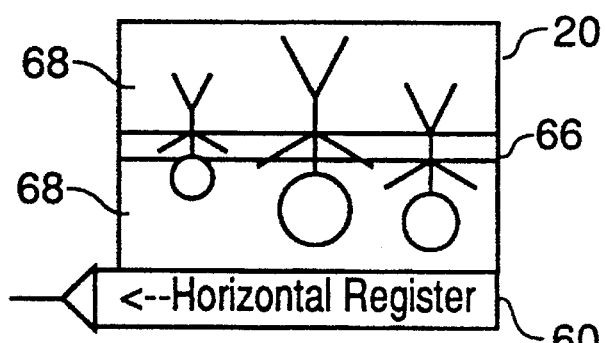
FIG. 3
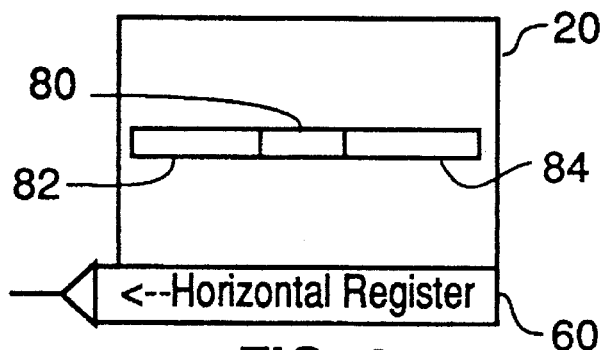
FIG. 4

ELECTRONIC CAMERA WITH RAPID AUTOMATIC FOCUS OF AN IMAGE UPON AN IMAGE SENSOR

FIELD OF THE INVENTION

The invention pertains to apparatus for automatically focusing an image upon an electronic image sensor and, more particularly, for rapidly focusing an image upon an image sensor based upon signals from a section of the sensor.

BACKGROUND OF THE INVENTION

An image sensor for an electronic camera ordinarily contains a two-dimensional array of light sensitive photosites. In an interline transfer sensor, the image charge is transferred from the photosites to light-protected vertical registers, through which the image charge is moved to a horizontal readout register. On the other hand, in a full frame image sensor the image charge is incremented line-by-line through the photosites themselves to a horizontal readout register, from which the image signal is obtained. Since the full frame image sensor does not contain a separate light-protected storage area, a shutter is normally used to block the light and prevent vertical smearing when reading out the image.

An example of an electronic still camera is the model DCS 200c camera, marketed by Eastman Kodak Company, Rochester, N.Y. This camera uses a high resolution full frame image sensor in an electronic camera back which attaches to a conventional 35 mm film camera body. The camera body includes a normal focal plane shutter for blocking image light. In this type of electronic camera, a separate focus sensor is used in the camera body to automatically focus the camera lens. This extra sensor increases the camera cost. It may also result in a less than optimally focused image on the sensor, if the tolerances of the camera lens focusing mechanism, and the tolerances of the focus detector, are not tightly controlled. Therefore, by using the high resolution image sensor itself to focus the camera lens, the camera cost may be reduced, and the camera focusing accuracy may be increased.

Focusing a camera lens by using the sensor output signal is an iterative process which requires capturing a sequence of images while varying the focus, until a focus-related parameter of the image, such as the "average contrast", is maximized. Prior art camcorders typically use NTSC format interline image sensors, which do not require a mechanical shutter, to perform this type of automatic lens focusing. In these camcorders, the same image that is recorded is also analyzed to provide the focus information. Focusing is done by spatially bandpass filtering a subsection of the video image read out from the sensor. The lens focus position is adjusted to obtain the highest average magnitude output signal (highest average contrast) from the bandpass filter. Note that the camcorder's image sensor is ordinarily read out at the video field rate (1/60 second) so that the same sensor operating mode is used to provide both the focus information and the final images. In such camcorders, many images may need to be read out before the lens is properly focused. Since the image readout time is relatively rapid (approximately 1/60 second), acceptable focus can typically be achieved in less than a second.

Focus time can be further improved by application of the technique shown in U.S. Pat. No. 5,051,833 (Tsuji). This patent describes an electronic still camera in which focus is based on a rectangular subset of the pixels on an interline charge coupled device (CCD) sensor. During the focusing operation, the image lines within the rectangle are read out slowly (regular video rates), while the lines outside of the rectangle are read out more rapidly to a charge drain on the CCD sensor. Tsuji thus describes a focusing mode which takes less time for reading out an image for the purpose of focusing than is taken for reading out an image for normal image capture. This focusing mode is employed with an interline transfer sensor, which has light-protected storage areas (vertical registers) and consequently does not require a mechanical shutter. Because the focusing image frames are not usable as captured images, this technique is not useful with camcorders. Moreover, focusing time can remain a problem if rapid utilization of the camera is desired or if longer readout times are required, such as for definitions higher than NTSC resolution.

With a full frame image sensor, it is commonly understood that mechanical shuttering is required to prevent vertical smear when reading out the sensor image, whether for focusing or normal imaging. This is particularly true for a high resolution full frame sensor having a relatively long readout time. Therefore, a mechanical shutter would need to be repeatedly opened and closed numerous times while capturing a sequence of images and focusing the lens. Therefore, full frame CCDs have not been used to perform autofocus in any known commercial electronic cameras. What is needed is a technique for rapidly focusing the lens of an electronic still camera which overcomes the problems just described.

SUMMARY OF THE INVENTION

In arriving at the invention, it was first realized that quick transfer of unwanted parts of the image could, for purpose of focus, reduce vertical smear in the remaining part of the image to the extent that the remaining section of the image could be used for focus evaluation. The problems noted above are then solved according to the invention by basing focus evaluation on a rapid open-shutter clearing of image charge from a full frame image sensor for a sequence of image cycles. More particularly, an electronic camera having an automatically-focused lens operates in a plurality of operating modes, including a first operating mode used while focusing the lens and a second operating mode used while reading out an image. The camera includes a full frame image sensor disposed in an optical path of the lens to receive image light, a shutter positioned in the optical path to block image light, and a processor section for controlling the sensor and the shutter during the two operating modes. In particular, the processor section holds the shutter open during the first operating mode for a plurality of image cycles, and closes the shutter during the second operating mode for transfer of an image.

In further definition of the invention, the processor section operates the sensor so as to transfer an image charge from the sensor more rapidly during the first operating mode than during the second operating mode.

In still further definition, the first operating mode utilizes a subsection of the image sensor for focusing the lens, and the processor section causes transfer of the portion of the image outside the subsection more rapidly from the image sensor than the portion of the image within the subsection.

Unlike the application of conventional automatic focusing techniques to full frame sensors, which would take several seconds with a high resolution sensor to bring the lens into focus, the advantage of the invention is that the entire focusing sequence occurs rapidly, taking only a fraction of a second. The conventional approach, moreover, has the shutter opening and closing every time the focus position is adjusted. This can lead to excessive shutter wear. The invention minimizes shutter wear, at least due to autofocus, by leaving the shutter open during the autofocus mode of operation.

BRIEF DESCRIPTION OF THE DRAWINGS

The invention will be described in relation to the drawings, whereon

FIG. 2 is a a diagram of a full frame image sensor useful with the camera of FIG. 1;

FIG. 3 is a diagram of the imaging portion of a sensor showing a central focusing area;

FIG. 4 is a diagram of the imaging portion of a sensor showing a central focusing area divided into regions;

DETAILED DESCRIPTION OF A PREFERRED EMBODIMENT

Figure 1:
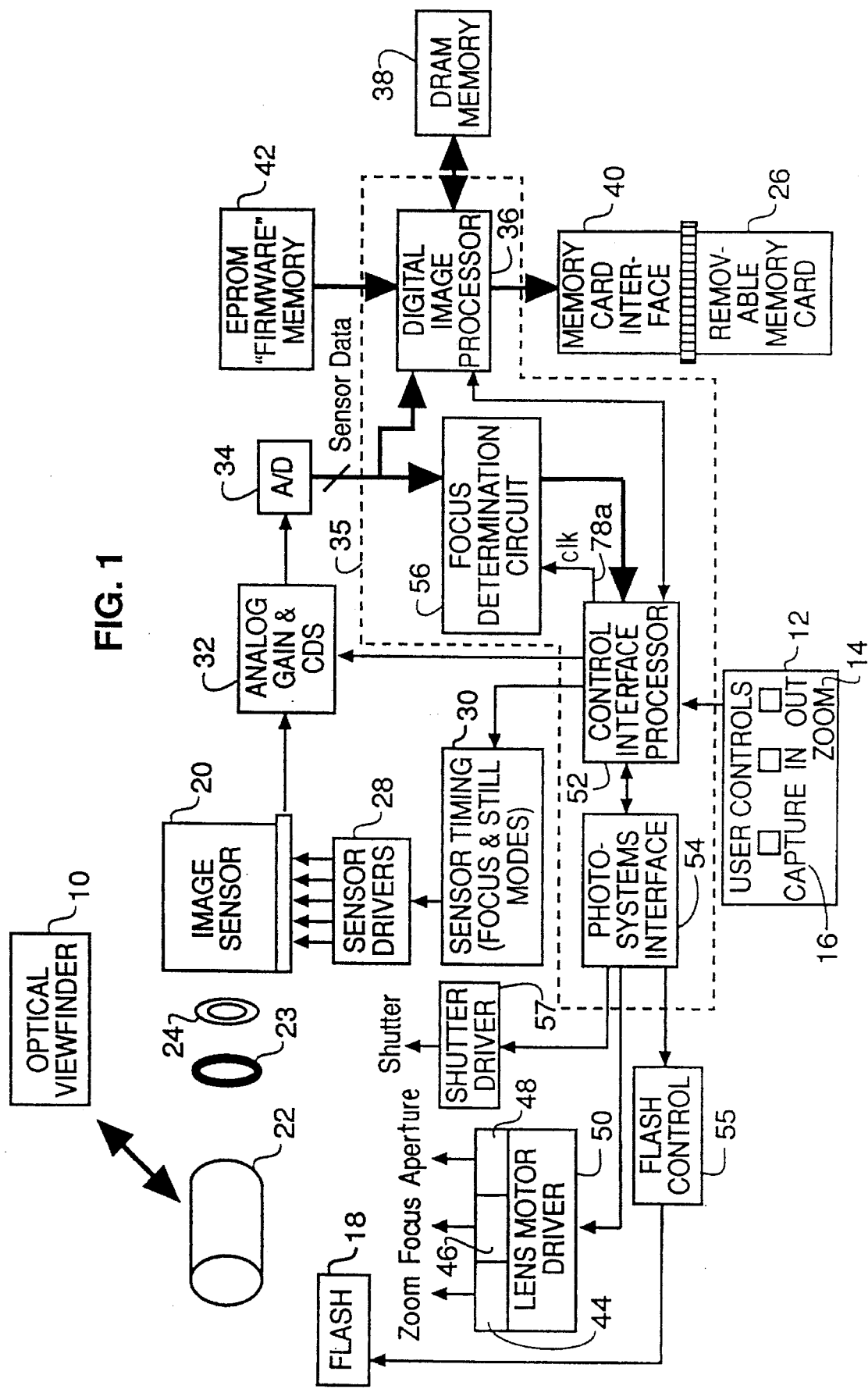
FIG. 1 is a block diagram of an electronic camera incorporating the invention.

A block diagram of a camera using an automatic focus apparatus according to the invention is shown in FIG. 1. The camera includes an optical viewfinder 10 and a user control section 12 having a number of user control buttons, including zoom buttons 14 and a capture button 16. To take a still picture, the user turns on the camera (using a power switch (not shown), which may be automatically enabled when the user depresses the zoom buttons 14 or partially depresses the capture button 16). The user composes the picture by depressing the "zoom in" or "zoom out" buttons 14, and by adjusting the position of the camera, while observing the viewfinder image. When the user is satisfied with the composition, the user depresses the capture button 16. The camera then captures a single still image, firing a flash 18 if necessary when the ambient illumination level is low. The still image is focused upon an image sensor 20 by a motor driven zoom lens 22. The intensity of the image light upon the sensor 20 is regulated by a motor driven mechanical aperture 23, while exposure time is regulated by a mechanical shutter 24. The still image from the image sensor 20 is processed and digitally stored on a removable memory card 26.

The camera includes a full frame color image sensor, as shown in FIG. 2. The sensor is clocked by sensor drivers 28 controlled by a sensor timing circuit 30. The output of the image sensor 20 is amplified, processed in an analog gain and sampling (correlated double sampling (CDS)) circuit 32, and converted to digital form in A/D converter 34. The A/D output signal is provided to a processor section 35, which includes a digital image processor 36 which temporarily stores the still images in a DRAM memory 38. The digital image processor 36 then performs image processing on the still images, and finally stores the processed images on the removable memory card 26 via a memory card interface circuit 40, which may use the PCMCIA 2.0 standard interface. EPROM memory 42 is used to store the firmware which operates the processor 36.

The motor driven zoom lens 22 includes a zoom motor 44, a focus motor 46, and an aperture motor 48 (all controlled by lens motor drivers 50). The processor section 35 includes control interface processor 52 connected to the lens motors via a photosystem interface block 54 for controlling the operation of the zoom lens 22. The lens zoom position is controlled by the photosystem interface block 54 based on position input from the zoom control buttons 14. The focus is set by the control interface processor 52 using the output of a focus determination circuit 56, also within the processor section 35, which receives image data from the A/D converter 34. The shutter 24 is controlled by a shutter driver 57 connected to the photosystems interface 54. The focus determination circuit 56 processes data according to a focusing algorithm (which will be described in connection with FIG. 6) applied to a selected area of the image sensor 20 as the sensor is operated in the focus mode. An iterative algorithm in the control interface processor 52 adjusts the lens focus position, depending on the output of the focus determination circuit 56 until the focus determination process provides a maximum contrast signal. Although the digital image processor 36 and the control interface processor 52 are shown as two separate blocks, in some implementations the same processor could be used to perform both of these functions (as well as other of the recited functions).

FIG. 2 shows a diagram of a full frame CCD image sensor in more detail. A preferred full frame image sensor is the Kodak model KAF-1600 CCD image sensor, which has a total of 1024 active lines with 1536 active pixels per line, and an image aspect ratio of 3:2. This sensor is described in the KAF-1600 Performance Specification document available from Eastman Kodak Company, Rochester, N.Y. Each pixel 59 is 9 microns "square", since both the vertical and horizontal distances between the centers of adjacent pixels are 9 microns. The sensor uses a color filter array pattern known as the "Bayer checkerboard" pattern, described in U.S. Pat. No. 3,971,065. In the normal operating mode, all of the pixels on the sensor are transferred to a horizontal register 60 and used to provide a final still resolution image. Table I shows specifications, including focusing times according to the invention, for the preferred KAF-1600 full frame sensor, and for a lower resolution KAF-400 sensor, also available from the Eastman Kodak Company. For instance, to read out the final still image from the KAF-1600 sensor requires approximately 800 mSec.

TABLE 1

| Full Frame Specifications | KAF-400 CCD | KAF-1600 CCD |
| --- | --- | --- |
| Total lines | 520 | 1032 |
| Total pixels per line | 792 | 1556 |
| H clock rate (MHz) | 2 | 2 |
| Pixel time (nSec) | 500 | 500 |
| Vertical transfer (μSec) | 6 | 6 |
| Line readout time (μSec) | 402 | 784 |
| Normal readout time (mSec) | 209.040 | 809.088 |
| Fast flush time (mSec) | 3.120 | 6.192 |
| Fast focus interval time (mSec) | 10 | 10 |
| Fast focus lines used | 1 | 1 |
| Fast focus smear (%) | 31 | 62 |

FIG. 3 shows a representative portion of imager which provides the data used to focus the image in the focusing operating mode. Only a small number of lines in a center region 66 of the image are used to provide the focus determination input data. For the full frame sensor, the other lines 68 are quickly read from the image by continuously cycling the vertical clocks and the horizontal clocks. This produces an unusable output signal for these lines, but allows them to be quickly read out from the image sensor. Since the image charge for the non-used lines are quickly flushed from the sensor, this operation is referred to as a "fast flush" and the focus mode is thus described as a fast flush focus mode. The time required to read out the image in the fast flush focus mode is well under 10 mSec. Although it may take 10 iterative cycles for proper focus in some cases, acceptable focus can still be achieved in a fraction of a second. Most importantly, an unshuttered sequence of center regions 66 do not show significant smear for the times involved. Consequently, as the level of smear is tolerable, the shutter driver 57 is allowed to hold the shutter 24 open during the focus mode.

In contrast to these short focus times, if the normal operating mode was used to focus the image using the sensor data from the KAF-1600 full frame image sensor of FIG. 2, the total focusing time would be at least 800 mSec times the number of iterative cycles needed to achieve acceptable focus. Since it may require 10 iterative cycles for proper focus in some cases, using the normal readout mode might take over 8 seconds to properly focus the lens. This would be unacceptably long.

Figure 5:
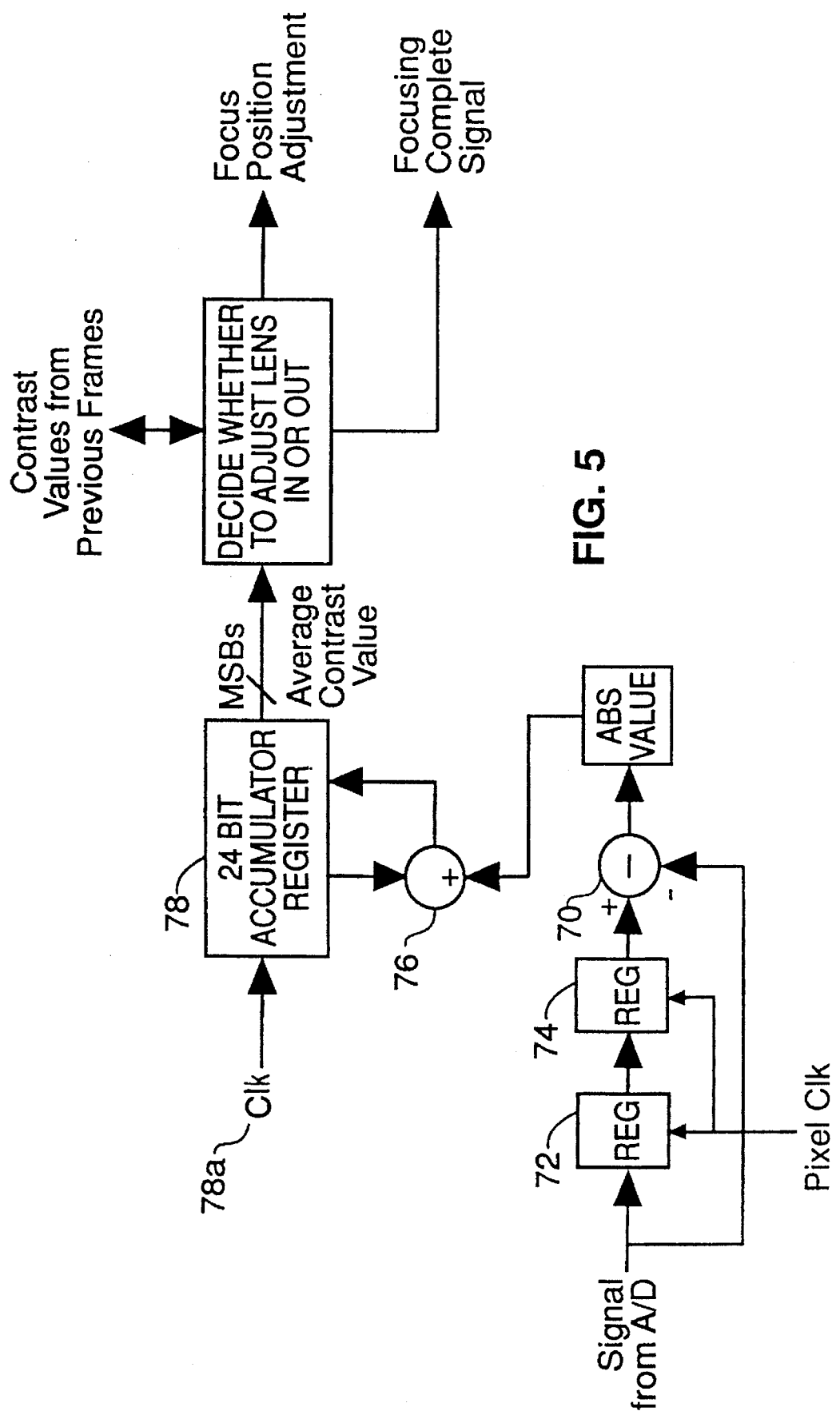
FIG. 5 is a block diagram of a focus determination circuit used in the camera of FIG. 1.

FIG. 5 shows the focus determination circuit. This circuit measures the "average contrast" (high frequency detail) of a portion of the image. The high frequency detail is obtained by a subtractor 70, which subtracts the value of the current input pixel output by the A/D converter 34 from the value of the A/D output delayed by two pixels, via two registers 72 and 74. The two register delay is used instead of a single register, since the horizontal color filter pattern along the line repeats every two pixels. This ensures that similarly colored pixels are subtracted. The output of the subtractor is zero when the values of the two pixels are identical. The magnitude of the subtractor output increases as the difference between pixel values increases. This subtractor output will be large near vertically oriented edges if the camera lens is well focused, but smaller near these same edges if the camera lens is not well focused. The absolute value of the subtractor output is combined in a summer 76 with an accumulated value from an accumulator register 78. This accumulated value is the average contrast value. A single average contrast value may be computed, for example, for the region 66 shown in FIG. 3. In this instance, an accumulator clock input 78a (provided by the control interface processor 52) would be enabled for all pixels in the center region 66 shown in FIG. 3, and disabled for any pixels outside this region. Alternately, the circuit in FIG. 5 could be modified to include multiple accumulators to store the average contrast for multiple regions in the image. For example, the average contrast could be computed for a center region 80, a left central region 82 and the right central region 84 as shown in FIG. 4.

Figure 6:
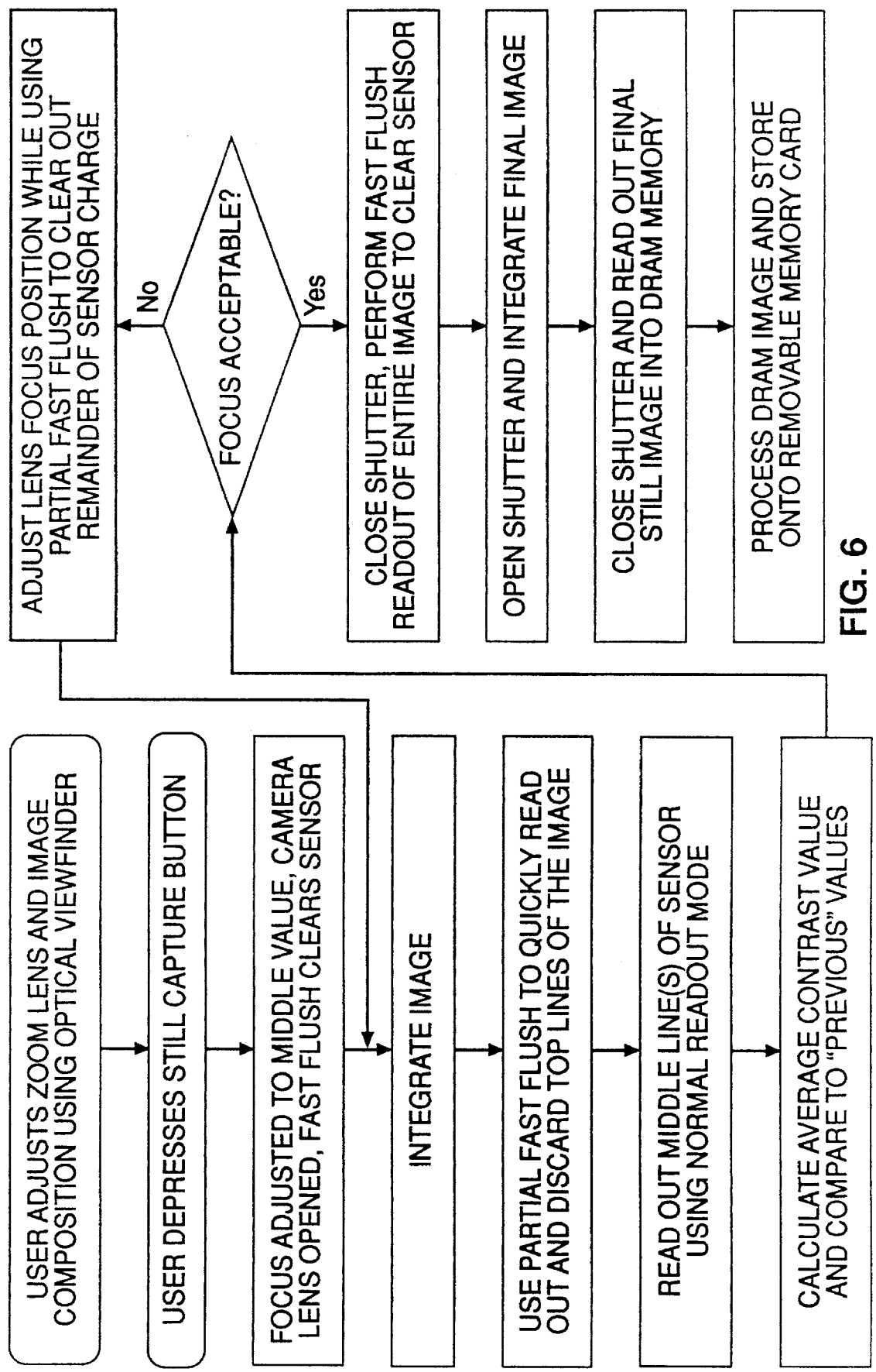
FIG. 6 is a flowchart showing the sequence of operations of the camera of FIG. 1.

FIG. 6 shows the operating sequence of the camera. The user adjusts the zoom setting and points the camera to compose the image, and then presses the still capture button 16. The camera focus is adjusted to a mid range position while the shutter 24 is opened and the sensor 20 is cleared of any charge using the fast flush operating mode for the entire sensor. An image, to be used for focusing the camera lens, is then integrated for a period of time, for example 10 mSec. During this imaging cycle, the shutter 24 remains open while a top portion of the image is rapidly read out and discarded, using "fast flush" clocking where the vertical and horizontal registers are continuously clocked. The vertical clock sequence is then returned to the normal readout operation, while a small number of lines in the center region 66 of the image are clocked out. The average absolute value output (average contrast) of a horizontal spatial bandpass filter processing these image lines is used to determine how well the image is focused. This average contrast value is stored by the control interface processor 52, and the lens focus is adjusted while the remainder of the image charge is cleared out using fast flush timing. The process of integrating and reading out the focus image is then repeated for a second imaging cycle. If the average contrast increases, the lens focus position is stepped again in the same direction. If the average contrast decreases, the focus position is moved in the opposite direction. These imaging cycles are repeated numerous times as the lens focus is adjusted until it provides the maximum average contrast. The entire focusing sequence occurs rapidly, taking only a fraction of a second. Once the average contrast has reached a maximum value, the focus is acceptable. At this point, the shutter 24 is closed, and the entire sensor 20 is cleared using "fast flush" clocking. The shutter 24 is again opened to capture the final image, and closed while the final image is read out.

Figure 7A:
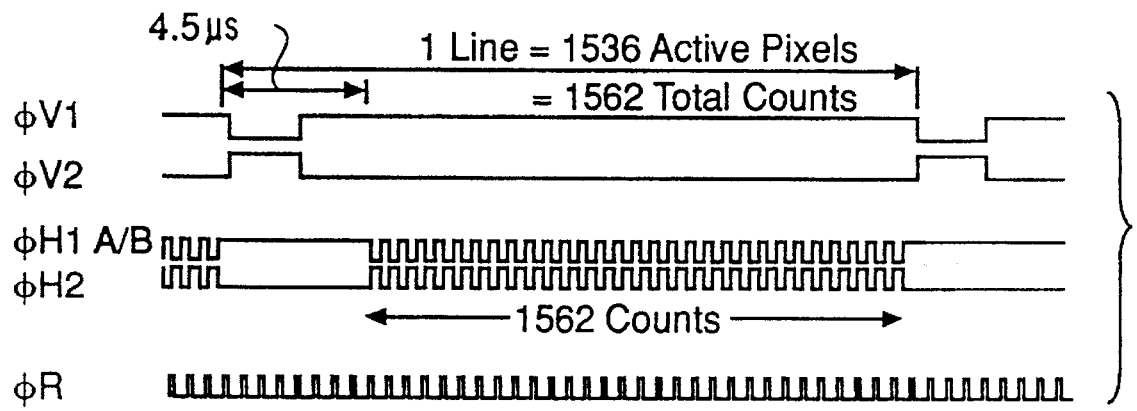
FIGS. 7A and 7B show the line timing for the normal readout mode and the focus readout mode, respectively.
Figure 7B:
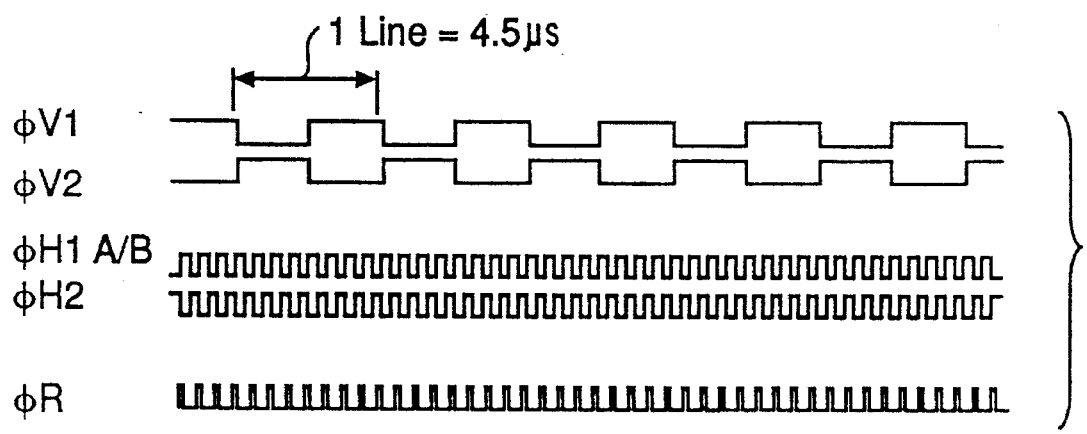

FIGS. 7A and 7B are line timing diagrams which shows the difference between the normal clocking mode and the "fast flush" clocking mode for a full frame sensor. Note that in the normal mode, one line of charge is transferred to the horizontal readout register 60 by cycling the vertical clocks high and low at the end of each line. The vertical clocks remain constant during the line while the horizontal clocks repeatedly cycle high and low to read out each pixel of the line. This mode provides a high quality output image and is used for the captured image and the focus image in the center region 66. In the fast flush mode shown in FIG. 7B, both the vertical clocks and the horizontal clocks continuously cycle high and low during line readout. This rapidly clears out the sensor charge, although it produces an unusable sensor output signal. This is not important, however, since the portion of the image read out in fast flush mode is not used for computing the image focus; it is simply discarded. This mode is used for the regions 68 surrounding the center region 66.

As mentioned, one drawback to keeping the shutter 24 open while transferring out the images used for focusing is that this produces a vertical smear signal. This occurs because the pixels continue to integrate light as the charge is transferred vertically. The amount of smear depends on the ratio of the readout time and the integration time. Using the fast flush mode to read out most of the image lines minimizes the smear signal. Table 1 shows that for a 10 mSec focus image integration time, the smear signal is approximately 60% of the desired image signal. This adds an "offset" signal to the image which reduces the dynamic range of the focusing signal slightly. If the normal readout mode were used, however, instead of the fast flash readout, with the shutter open, the smear signal would be far greater than the desired image signal. This would make it impossible to achieve proper focus.

In the case of low light levels, a 10 mSec integration time may not be enough to achieve a high enough signal level. In this case, a number of image lines (for example 4, 8, or 16 lines) may be summed vertically into the horizontal register to provide the desired focus image signal.

The invention has been described with reference to a preferred embodiment. However, it will be appreciated that variations and modifications can be effected by a person of ordinary skill in the art without departing from the scope of the invention. For instance, while the zoom lens has been described as having motor driven elements, such as for focusing, such elements may be moved by piezoelectric means instead of a motor.

| PARTS LIST | |
|---|---|
| 10 | optical viewfinder |
| 12 | control section |
| 14 | zoom buttons |
| 16 | capture button |
| 18 | flash |
| 20 | image sensor |
| 22 | zoom lens |
| 23 | mechanical aperture |
| 24 | mechanical shutter |
| 26 | memory card |
| 28 | CCD drivers |
| 30 | CCD timing circuit |
| 32 | analog gain and CDS |
| 34 | A/D converter |
| 35 | processor section |
| 36 | processor |
| 38 | DRAM memory |
| 40 | interface |
| 42 | EPROM memory |
| 44 | zoom motor |
| 46 | focus motor |
| 48 | variable aperture |
| 50 | lens motor drivers |
| 52 | control interface processor |
| 54 | photosystems interface |
| 55 | flash controller |
| 56 | focus determination circuit |
| 57 | shutter driver |
| 58 | color filter array pattern |
| 59 | pixel |
| 60 | horizontal register |
| 66 | center region |
| 68 | other lines |
| 70 | subtractor |
| 72, 74 | registers |
| 76 | summer |
| 78 | accumulator register |
| 80 | center region |
| 82 | left central region |
| 84 | right central region |

We claim:

1. An electronic camera having an automatically-focused lens that images light through a shutter upon an image sensor during separate image focus and image capture cycles, the shutter operable to regulate light upon the sensor and the lens operable to focus an image based upon image data obtained from the sensor during image focus cycles, the improvement wherein the image sensor is a full frame transfer image sensor in which image charge is incremented line-by-line through photosites on the sensor to an output section; and the shutter remains open during a plurality of image focus cycles while the lens is being focused, wherein consequent image smear is reduced to an acceptable level by transferring image charge from the sensor more rapidly during focusing than during image capture, and the shutter is closed in order to eliminate image smear before reading out an image after an image capture cycle.

2. An electronic camera as claimed in claim 1 wherein the lens is focused based upon image data obtained from a central region of the image sensor, and wherein the rapid transfer of image charge is obtained by transferring lines of image charge in the region surrounding the central region more rapidly than lines of image charge in the central region itself.

3. An electronic camera as claimed in claim 2 wherein the image sensor has a horizontal readout register and inputs for a vertical clock that transfers lines of image charge to the horizontal register and a horizontal clock that transfers image charge from the horizontal register, wherein the rapid transfer of image charge is obtained by simultaneously cycling both vertical and horizontal clocks for the region surrounding the central region.

4. An electronic camera having an automatically-focused lens and a plurality of operating modes, including a first operating mode used while focusing the lens and a second operating mode used while reading out an image, said camera comprising:

a full frame transfer image sensor in which image charge is incremented line by line through photosites on the sensor to an output section, said image sensor disposed in an optical path of the automatically-focused lens to receive image light;

a sensor driver for transferring an image from the sensor;

a shutter positioned in the optical path to block image light from striking the image sensor;

a shutter driver for driving the shutter open or closed; and a processor section for controlling the sensor driver and the shutter driver during the respective operating modes such that the shutter driver holds the shutter open for a plurality of image cycles during the first operating mode, and holds the shutter closed during transfer of an image during the second operating mode.

5. An electronic camera as claimed in claim 4 wherein the sensor driver is controlled by the processor section to transfer an image from the sensor more rapidly during the first operating mode than during the second operating mode.

6. An electronic camera as claimed in claim 5 wherein the first operating mode utilizes a subsection of the image sensor for focusing the lens, and wherein during the first operating mode the sensor driver transfers the portion of the image outside of the subsection more rapidly from the image sensor than the portion of the image within the subsection.

7. An electronic camera as claimed in claim 6 wherein during the first operating mode the sensor driver transfers the portion of the image within the subsection of the image sensor at the same timing rate as an image is transferred from the image sensor during the second operating mode.

8. A method for operating an electronic camera having an automatically-focused lens that images light through a mechanical shutter upon a full frame transfer image sensor during separate image focus and image capture cycles, said method comprising the steps of:

maintaining the shutter open during a plurality of image focus cycles while the lens is being focused;

transferring image charge from the sensor during focus cycles more rapidly than after image capture cycles;

closing the shutter after an image capture cycle; and transferring image charge from the sensor after a capture cycle more slowly than during the focusing cycles.

9. The method as claimed in claim 8, wherein an area of the image sensor is defined as a focus region, said method further comprising the step of:

transferring image charge during focus cycles more rapidly from the region surrounding the focus region than from focus region itself.

\* \* \* \* \*